US009144172B2

(12) United States Patent  
Bergthold et al.

(10) Patent No.: US 9,144,172 B2  
(45) Date of Patent: Sep. 22, 2015

(54) MODULAR DATA CENTER AND ASSOCIATED METHODS

(75) Inventors: Rudy Bergthold, Aptos, CA (US); David Ibarra, Redwood City, CA (US)

(73) Assignee: Cupertino Electric, Inc., San Jose, CA (US)

( * ) Notice: Subject to any disclaimer, the term of this patent is extended or adjusted under 35 U.S.C. 154(b) by 0 days.

(21) Appl. No.: 13/570,166

(22) Filed: Aug. 8, 2012

(65) Prior Publication Data

US 2012/0300372 A1    Nov. 29, 2012

Related U.S. Application Data

(63) Continuation of application No. 12/728,152, filed on Mar. 19, 2010, now Pat. No. 8,264,840.

(60) Provisional application No. 61/178,921, filed on May 15, 2009, provisional application No. 61/306,382, filed on Feb. 19, 2010.

(51) Int. Cl.  
*H05K 7/20* (2006.01)  
*F25D 23/12* (2006.01)  
(Continued)

(52) U.S. Cl.  
CPC ............ *H05K 7/1457* (2013.01); *H05K 7/1497* (2013.01); *E04H 2001/1283* (2013.01)

(58) Field of Classification Search  
CPC .......... H05K 7/20745; H05K 7/20754; H05K 7/20736; H05K 7/20172; H05K 7/20727; G06F 1/20; G06F 1/203; H01L 23/467  
See application file for complete search history.

(56) References Cited

U.S. PATENT DOCUMENTS 3,925,679 A    12/1975  Berman et al.  
4,429,734 A    2/1984   Vandervaart  
(Continued)

FOREIGN PATENT DOCUMENTS

GB           2446454 A      8/2008  
WO     WO 2008/075050 A2    6/2008  
(Continued)

OTHER PUBLICATIONS

Generation 4 design, http://loosebolts.wordpress.com/2008/12/02/our-vision-for-generation-4-modular-data-centers-one-way-of-getting-it-just-right/http://video.msn.com/video.aspx?mkt=en-us&vid=b4d189d3-19bd-42b3-85d7-6ca46d97fe40.  
(Continued)

*Primary Examiner* — Hoa C Nguyen  
*Assistant Examiner* — Xanthia C Cunningham  
(74) *Attorney, Agent, or Firm* — Martine Penilla Group, LLP

(57) ABSTRACT

A number of structural modules are configured to be secured together and to be secured to a foundation. Each of the structural modules is without one or more sidewalls, such that when the structural modules are secured together they form a building structure that encloses an open region which continuously extends through interiors of the structural modules. Each of the number of structural modules is structurally formed to be independently transported. A power module is configured to be secured to one of the structural modules and to the foundation. The power module is defined as an enclosed structure and is structurally formed to be independently transported. The power module is equipped with electrical components for supplying and distributing electrical power to a pre-defined layout of data equipment to be deployed within the open region of the building structure formed by the number of structural modules.

19 Claims, 7 Drawing Sheets

(51) Int. Cl.
*H05K 7/14* (2006.01)
*E04H 1/12* (2006.01)

(56) References Cited

U.S. PATENT DOCUMENTS

| | | | |
|---|---|---|---|
| 6,142,090 A * | 11/2000 | Jakuba et al. | 114/65 R |
| 6,188,139 B1 | 2/2001 | Thaxton et al. | |
| 6,738,692 B2 * | 5/2004 | Schienbein et al. | 700/286 |
| 6,768,640 B2 | 7/2004 | Doblar et al. | |
| 6,999,291 B2 | 2/2006 | Andarawis et al. | |
| 7,046,514 B2 * | 5/2006 | Fink et al. | 361/695 |
| 7,224,581 B2 * | 5/2007 | Garnett et al. | 361/679.49 |
| 7,278,273 B1 | 10/2007 | Whitted et al. | |
| 7,430,118 B1 | 9/2008 | Noteboom et al. | |
| 7,456,513 B2 * | 11/2008 | Meyers et al. | 290/54 |
| 7,568,360 B1 * | 8/2009 | Bash et al. | 62/186 |
| 7,738,251 B2 * | 6/2010 | Clidaras et al. | 361/701 |
| 7,856,838 B2 * | 12/2010 | Hillis et al. | 62/259.2 |
| 7,961,463 B2 * | 6/2011 | Belady et al. | 361/695 |
| 7,990,710 B2 * | 8/2011 | Hellriegel et al. | 361/699 |
| 8,411,439 B1 * | 4/2013 | Carlson et al. | 361/699 |
| 8,498,110 B2 * | 7/2013 | Wei | 361/679.5 |
| 2002/0196609 A1 * | 12/2002 | Golightly et al. | 361/736 |
| 2003/0036806 A1 * | 2/2003 | Schienbein et al. | 700/1 |
| 2003/0229423 A1 * | 12/2003 | Andarawis et al. | 700/286 |
| 2004/0095716 A1 | 5/2004 | McAlister | |
| 2004/0184232 A1 | 9/2004 | Fink | |
| 2004/0223300 A1 * | 11/2004 | Fink et al. | 361/690 |
| 2005/0235671 A1 | 10/2005 | Belady et al. | |
| 2006/0065000 A1 * | 3/2006 | Belady | 62/259.2 |
| 2006/0082263 A1 * | 4/2006 | Rimler et al. | 312/201 |
| 2006/0139877 A1 * | 6/2006 | Germagian et al. | 361/695 |
| 2006/0176677 A1 * | 8/2006 | Glovatsky et al. | 361/796 |
| 2006/0225446 A1 * | 10/2006 | Bash et al. | 62/178 |
| 2006/0260338 A1 | 11/2006 | VanGilder et al. | |
| 2006/0272342 A1 | 12/2006 | Bash et al. | |
| 2007/0038414 A1 | 2/2007 | Rasmussen et al. | |
| 2007/0076373 A1 * | 4/2007 | Fink | 361/695 |
| 2007/0135032 A1 * | 6/2007 | Wang | 454/184 |
| 2007/0167125 A1 | 7/2007 | Rasmussen et al. | |
| 2007/0278860 A1 | 12/2007 | Krieger et al. | |
| 2007/0291433 A1 * | 12/2007 | Ziegler et al. | 361/93.1 |
| 2008/0011589 A1 * | 1/2008 | Ball et al. | 200/5 A |
| 2008/0018175 A1 * | 1/2008 | McNamara et al. | 307/84 |
| 2008/0055846 A1 | 3/2008 | Clidaras et al. | |
| 2008/0055850 A1 | 3/2008 | Carlson et al. | |
| 2008/0064317 A1 * | 3/2008 | Yates et al. | 454/118 |
| 2008/0077368 A1 * | 3/2008 | Nasle | 703/4 |
| 2008/0094797 A1 * | 4/2008 | Coglitore et al. | 361/687 |
| 2008/0105412 A1 | 5/2008 | Carlsen et al. | |
| 2008/0105476 A1 * | 5/2008 | Korich et al. | 180/65.2 |
| 2008/0123288 A1 * | 5/2008 | Hillis | 361/687 |
| 2008/0232064 A1 | 9/2008 | Sato et al. | |
| 2008/0285232 A1 | 11/2008 | Claassen et al. | |
| 2009/0021907 A1 * | 1/2009 | Mann et al. | 361/686 |
| 2009/0050591 A1 * | 2/2009 | Hart et al. | 211/162 |
| 2009/0086432 A1 | 4/2009 | Campbell et al. | |
| 2009/0087695 A1 * | 4/2009 | Silberbauer | 429/9 |
| 2009/0157858 A1 * | 6/2009 | Bolan et al. | 709/223 |
| 2009/0168659 A1 * | 7/2009 | Matityahu et al. | 370/252 |
| 2009/0173473 A1 * | 7/2009 | Day | 165/67 |
| 2009/0223240 A1 | 9/2009 | Bean, Jr. | |
| 2009/0229194 A1 * | 9/2009 | Armillas | 52/79.1 |
| 2009/0235097 A1 * | 9/2009 | Hamilton et al. | 713/320 |
| 2009/0241578 A1 * | 10/2009 | Carlson et al. | 62/259.2 |
| 2009/0277605 A1 * | 11/2009 | VanGilder et al. | 165/67 |
| 2010/0051563 A1 * | 3/2010 | Schreiber | 211/26 |
| 2010/0091449 A1 * | 4/2010 | Clidaras et al. | 361/679.49 |
| 2010/0139887 A1 * | 6/2010 | Slessman | 165/67 |
| 2010/0328849 A1 * | 12/2010 | Ewing et al. | 361/622 |
| 2011/0096496 A1 * | 4/2011 | Doo et al. | 361/689 |

FOREIGN PATENT DOCUMENTS

| | | |
|---|---|---|
| WO | WO 2008/127344 A1 | 10/2008 |
| WO | WO 2008/143503 A1 | 11/2008 |
| WO | WO 2008/152416 A1 | 12/2008 |

OTHER PUBLICATIONS

Sun modular datacenter, http://www.sun.com/products/sunmd/s20/.
Google container data center, http://www.youtube.com/watch?v=zRwPSFpLX8l.
Ice Cube Modular Data Center, http://www.rackable.com/products/icecube.aspx.

* cited by examiner

MODULAR DATA CENTER AND ASSOCIATED METHODS

CLAIM OF PRIORITY

This application is a continuation application under 35 U.S.C. 120 of prior U.S. patent application Ser. No. 12/728,152, filed Mar. 19, 2010 now U.S. Pat. No. 8,264,840, and entitled "Modular Data Center and Associated Methods," which claims priority under 35 U.S.C. 119(e) to each of 1) U.S. Provisional Patent Application No. 61/178,921, filed May 15, 2009, and 2) U.S. Provisional Patent Application No. 61/306,382, filed Feb. 19, 2010. Each of the above-identified patent applications is incorporated herein by reference in its entirety.

BACKGROUND

A data center is a structure defined to enclose, secure, maintain, and power a large number of computer systems. The computer systems within the data center are generally rack-mounted computer systems in which a number of removable electronics modules are stacked relative to each other within a support frame. The data center is defined to maintain interior ambient conditions suitable for proper operation of the computer systems therein. Also, the data center is defined to distribute power to the various computer systems therein.

One type of conventional data center is constructed using standard building construction techniques based on an architectural plan. This type of conventional data center is constructed entirely on-site as a "stick-built" structure, and is neither transportable, nor re-configurable. Also, because this type of "stick-built" data center is constructed on-site, it follows that installation of electrical equipment, including power supply and distribution equipment, must be performed on-site after construction of the data center building portion is completed. Deployment of a standard "stick-built" data center requires extensive time in planning and construction, with commensurate financial expense.

Another type of conventional data center is a containerized transportable data center defined essentially as a standard shipping container that includes a number of computing systems and associated support systems, such as cooling systems and power supply and distribution systems. The containerized transportable data center can be transported to a location where needed and be operated independently. The containerized transportable data center is a useful alterative to the convention "stick-built" data center when the amount of computing power needed at a given location can be provided by a very limited number of containerized transportable data centers. However, for a data center that requires substantial computing resources beyond the capacity afforded by a very limited number of containerized transportable data centers, deployment of numerous containerized transportable data centers becomes untenable.

More specifically, a duplicity of equipment across the numerous containerized transportable data centers becomes quite inefficient and uneconomical. For example, deployment of five transportable data centers will involve all costs associated with five separate structures, five separate power supply and distribution systems, five separate cooling systems, five separate monitoring systems, etc. In addition, there can be inefficiencies and complexities associated with linking the computing systems within/between the numerous containerized transportable data centers at a given deployment location. Also, there can be complexities and increased costs associated with having to supply outside power to each of the numerous containerized transportable data centers at a given deployment location.

In view of the foregoing, there is a need for an improved data center design and implementation.

SUMMARY OF THE INVENTION

In one embodiment, a modular data center is disclosed. The modular data center includes a foundation. A number of structural modules are configured to be secured together and to be secured to the foundation. Each of the number of structural modules is without one or more sidewalls, such that when the number of structural modules are secured together they form a building structure that encloses an open region. The open region continuously extends through interiors of the number of structural modules. Also, each of the number of structural modules is structurally formed to be independently transported. The modular data center also includes data equipment deployed within the open region of the building structure formed by the number of structural modules. The modular data center further includes a power module configured to be secured to one of the number of structural modules and to be secured to the foundation. The power module is defined as an enclosed structure and is structurally formed to be independently transported. The power module is equipped with electrical components for supplying and distributing electrical power to the data equipment deployed within the open region of the building structure formed by the number of structural modules.

In another embodiment, a method is disclosed for making a modular data center. The method includes fabricating a foundation at an assembly location of the modular data center. The method also includes fabricating a number of structural modules at a first remote location away from the assembly location of the modular data center. Each structural module is fabricated to be secured together and to be secured to the foundation at the assembly location of the modular data center. Each of the number of structural modules is fabricated without one or more sidewalls, such that when the number of structural modules are secured together at the assembly location of the modular data center they form a building structure that encloses an open region. Each of the number of structural modules is structurally formed to be independently transported. The method also includes fabricating a power module at a second remote location away from the assembly location of the modular data center. The power module is fabricated as an enclosed structure and is structurally formed to be independently transported. The power module is equipped at the remote location with electrical components for supplying and distributing electrical power to data equipment to be deployed within the open region of the building structure formed by the number of structural modules. The method also includes transporting the number of structural modules from the first remote location to the assembly location of the modular data center, and transporting the power module from the second remote location to the assembly location of the modular data center. The method also includes securing the number of structural modules together at the assembly location of the modular data center and to the foundation to form the building structure that encloses the open region, such that the open region continuously extends through interiors of the number of structural modules. The method also includes securing the power module to one of the number of structural modules and to the foundation at the assembly location of the modular data center.

In another embodiment, a power module for a modular data center is disclosed. The power module includes a main switchboard configured to receive electrical power from an outside electrical power source. The main switchboard includes a number of separate and independently controllable main bus segments. The power module also includes a number of uninterruptable power supply systems electrically connected in a respective manner to the main bus segments. Each of the number of uninterruptable power supply systems is defined to supply electrical power to a respective set of power distribution units within the modular data center. Each set of power distribution units supplies electrical power to a respective portion of data equipment within the modular data center. The power module further includes an intelligent power transfer system configured to ensure that an electrical load associated with a given main bus segment is transferred to other main bus segments when the given main bus segments inoperable.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
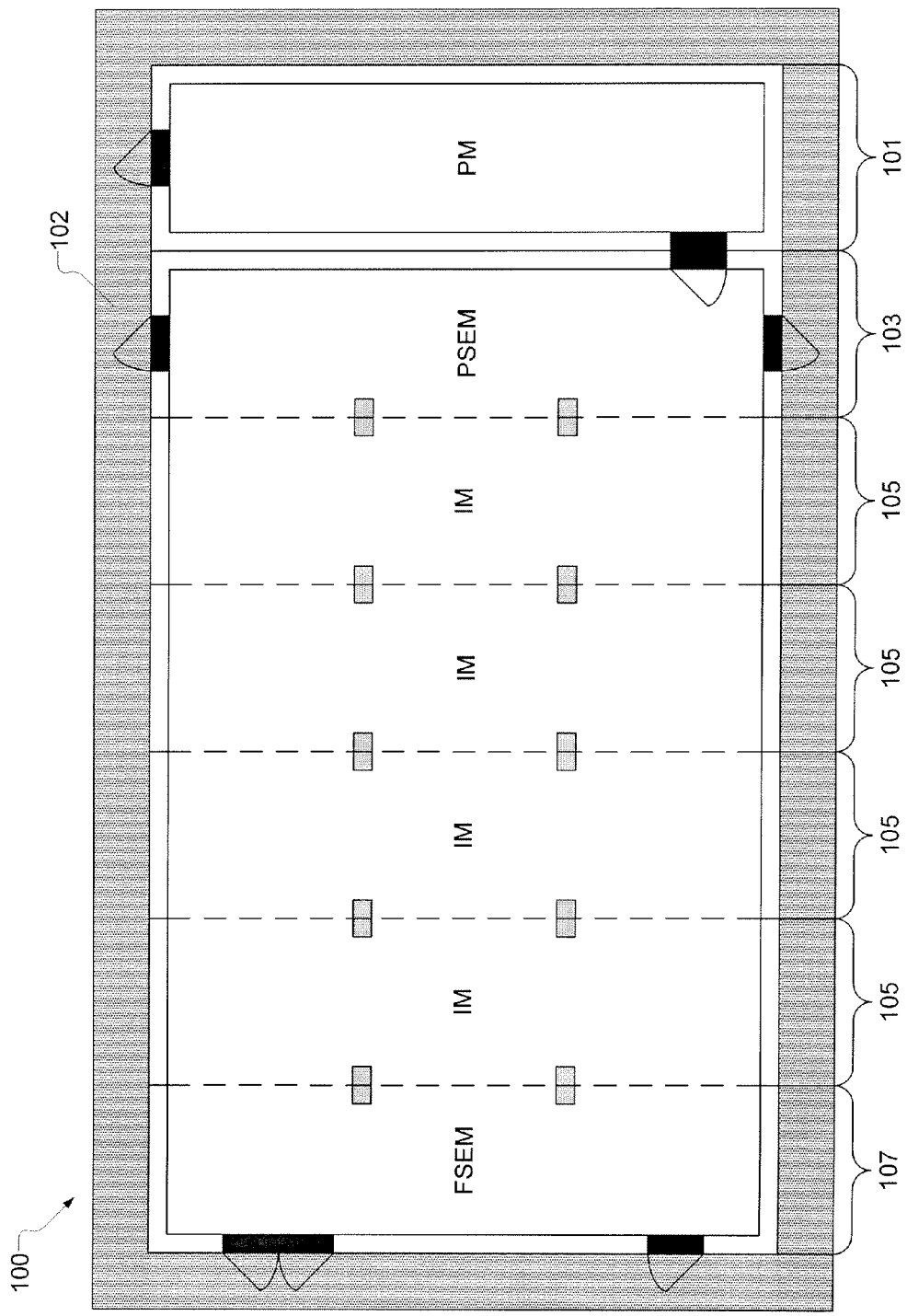
FIG. 1 shows an exemplary assembled modular data center, in accordance with one embodiment of the present invention.

FIG. 1 shows an exemplary assembled modular data center 100, in accordance with one embodiment of the present invention. The assembled modular data center 100 includes a number of different types of modules, such as a power module 101, a power side end module 103, a number of central modules 105, and a facility side end module 107. The various modules are manufactured off-site (i.e., away from the actual data center assembly location), transported to the data center assembly location, and assembled together at the data center assembly location to form an integrated data center structure. Efficiencies in cost and time are provided by manufacturing the various modules off-site at properly equipped manufacturing facilities. It should be understood that the modular data center 100 described herein is not dependent on any particular type of electronic data processing equipment or associated manufacturer. In other words, the modular data center 100 can be deployed and assembled at any data center assembly location to form an integrated data center structure to house any type of data center equipment for any purpose.

At the data center assembly location, a foundation is constructed upon which the data center is to be assembled and secured. In one embodiment, the foundation is a concrete pad. Upon arriving at the data center assembly location, the various modules are secured together to assemble the integral data center structure. The various modules are also secured to the foundation. The various modules are defined such that once secured together the overall enclosure of the data center is formed. It should be appreciated that under normal operating conditions, assembly of the modular data center can be completed in less than one month following completion of the foundation, which is substantially faster than traditional building construction. Additionally, it should be understood that the assembled modular data center is an integral building structure, as opposed to a ere collection of independent modules or shipping containers.

As mentioned above, each module of the modular data center is designed to be positioned on the foundation at the data center assembly location, secured to the foundation, and secured to one or more adjacently placed modules. Each module has an appropriate number of outer walls and a roof that is constructed at the off-site manufacturing facility. In one embodiment, the modules are steel framed to withstand the forces of movement, transportation, seismic, and/or natural structural loads when moving to or when assembled at the assembly site. In one embodiment, each module can also include interior finishes as required for fabrication at the off-site manufacturing facility. In one embodiment, the interior finishes can include flooring. In another embodiment, each module can include an open floor support frame constructed at the off-site manufacturing facility, and rely upon the foundation at the assembly location to provide the solid flooring surface of the assembled data center. Each module has a specific size based in part on the floor space required for the overall data center, which is primarily a function of the number of computing devices to be installed in the overall data center. In one embodiment, each module is defined to have a substantially equal size. In one example of this embodiment, the module size is 12 ft. wide and 50 ft. long. However, it should be understood that in other embodiments the module size can vary as required to implement the desired data center arrangement and overall data center size. Additionally, in one embodiment, different types of modules can have different sizes.

The modules which comprise the modular data center include a power module and a number of different structural modules. There are a limited number of structural module types to promote consistency and efficiency in fabrication and on-site assembly. In one embodiment, the structural module types include a power-side-end-module, an interior module, and a facility-side-end-module. The power-side-end-module is defined to interface with and secure to the power module. The facility-side-end-module is defined to provide data center communication connections with a facility that will utilize the assembled modular data center. The interior modules are defined to fit together between the power-side-end-module and facility-side-end-module, and interface with each of the power-side-end-module and facility-side-end-module. When secured together on the foundation, the combination of the power module, power-side-end-module, interior modules, and facility-side-end-module form an integral and fully operational data center. It should also be appreciated that the modular data center can be disassembled and moved, if necessary, thereby further distinguishing the modular data center from conventional building construction.

Structural components of the various structural modules are fabricated and assembled at the off-site manufacturing facility before shipment to the assembly site. Various utility, system, and assembly components are designed within the structural components to increase flexibility and efficiency of the assembly. Also, components of the structural modules that are more easily installed at the off-site manufacturing facility are installed within the structural modules prior to their shipment to the assembly site. Each structural module is accompanied to the assembly site by a corresponding installation kit. The installation kit for a given structural module includes components that are designed to provide single point connections, terminations, or finishes that are more efficiently installed at the assembly site following placement and securing of the structural module on the foundation. By way of example, the installation kit can include fire suppression interconnects, notification interconnects, module anchorage connections, module lifting connections, security interconnects, module and finishes connections. In some embodiments, the installation kit can also include smoke/fire detectors, various types of notification devices, lights, security components, fire suppression devices, power and data cable management components, among many other types of devices and components. To the extent possible, module-specific electrical equipment is installed during fabrication of the structural modules at the offsite manufacturing facility. This reduces and simplifies electrical work at the modular data center assembly site.

The power module 101 is a fully enclosed structure defined to house the power management and distribution systems for the assembled modular data center 100. Structurally, the power module 101 includes four walls, a ceiling, a floor, and one or more access doors. In one embodiment, the power module 101 is constructed as a steel framed structure. The power module 101 structure can be independently secured, i.e., locked and monitored. The assembled modular data center arrangement and corresponding power management and distribution requirements are pre-defined, thereby enabling the power management and distribution systems within the power module 101 to be pre-designed. The power module 101 is fully equipped with all required electrical components installed off-site at the manufacturing facility prior to transportation of the power module 101 to the modular data center assembly site.

Figure 2A:
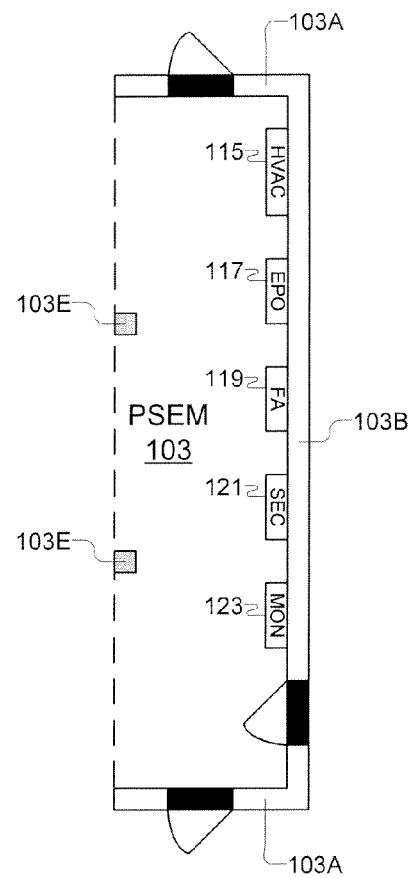
FIGS. 2A and 2B show a structural arrangement of the power-side-end-module, in accordance with one embodiment of the present invention.
Figure 2B:
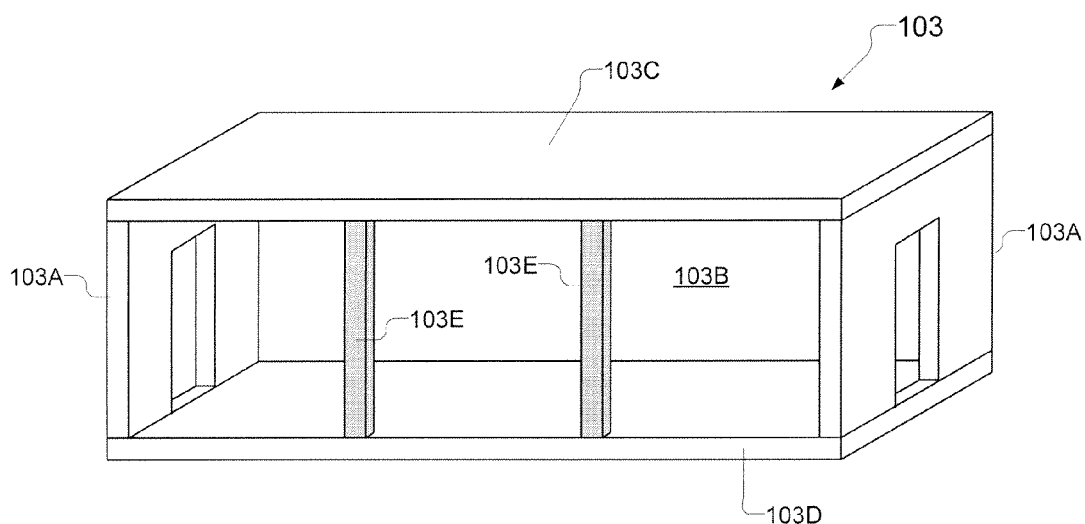

FIGS. 2A and 2B show a structural arrangement of the power-side-end-module 103, in accordance with one embodiment of the present invention. The power-side-end-module 103 is a partially enclosed structure defined to be secured to a side of the power module 101 that faces toward the assembled modular data center 100. More specifically, the power-side-end-module 103 includes three walls (two end walls 103A and one side wall 103B), and a roof 103C. In one embodiment, the power-side-end-module 103 includes a floor 103D. In another embodiment, the power-side-end-module 103 includes an open floor support frame constructed at the off-site manufacturing facility, and relies upon the foundation at the assembly location to provide the solid flooring surface of the power-side-end-module 103. The power-side-end-module 103 can also include a number of structural components 103E to support the roof 103C at the open side.

In one embodiment, the power-side-end-module 103 includes one or more access doors. Also, in one embodiment, the power-side-end-module 103 is equipped to include controls for data center global systems, such as security controls 121, HVAC controls 115, emergency power off (EPO) controls 117, fire alarm controls 119, power distribution unit (PDU) monitoring controls 123, lighting controls, and any other type of data center global control necessary for the particular data center arrangement/design.

Figure 3A:
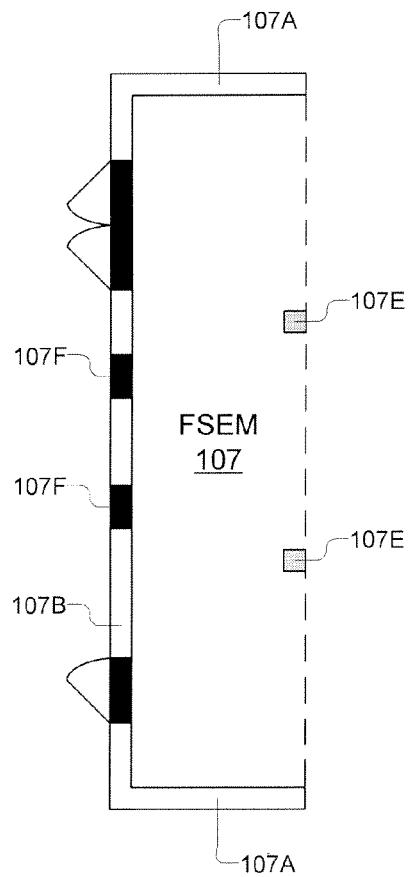
FIGS. 3A and 3B show a structural arrangement of the facility-side-end-module, in accordance with one embodiment of the present invention.
Figure 3B:
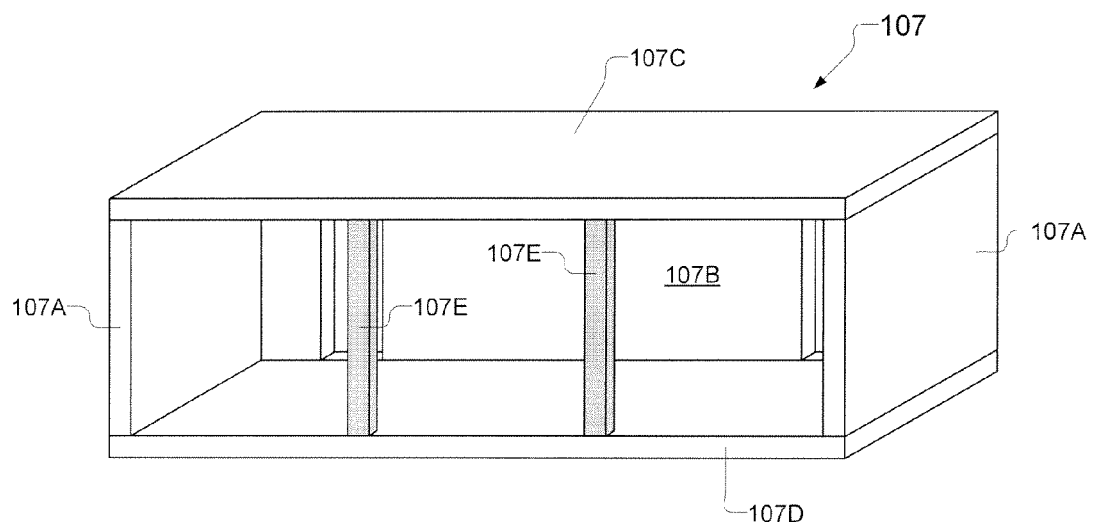

FIGS. 3A and 3B show a structural arrangement of the facility-side-end-module 107, in accordance with one embodiment of the present invention. The facility-side-end-module 107 is a partially enclosed structure defined to be secured to interior module 105, such that an open side of the facility-side-end-module 107 faces the interior module 105. More specifically, the facility-side-end-module 107 includes three walls (two end walls 107A and a side wall 107B), and a roof 107C. In one embodiment, the facility-side-end-module 107 includes a floor 107D. In another embodiment, the facility-side-end-module 107 includes an open floor support frame constructed at the off-site manufacturing facility, and relies upon the foundation at the assembly location to provide the solid flooring surface of the facility-side-end-module 107. The facility-side-end-module 107 can also include a number of structural components 107E to support the roof 107C at the open side.

In one embodiment, the facility-side-end-module 107 includes one or more access doors. The facility-side-end-module 107 is configured such that its side wall 107B defines an external wall of the assembled modular data center 100 through which the assembled modular data center 100 interfaces with the outside facility. The side wall 107B of the facility-side-end-module 107 includes a number of ports 107F through which data cables can be routed to connect the data center computer systems and associated devices with the outside facility.

Figure 4A:
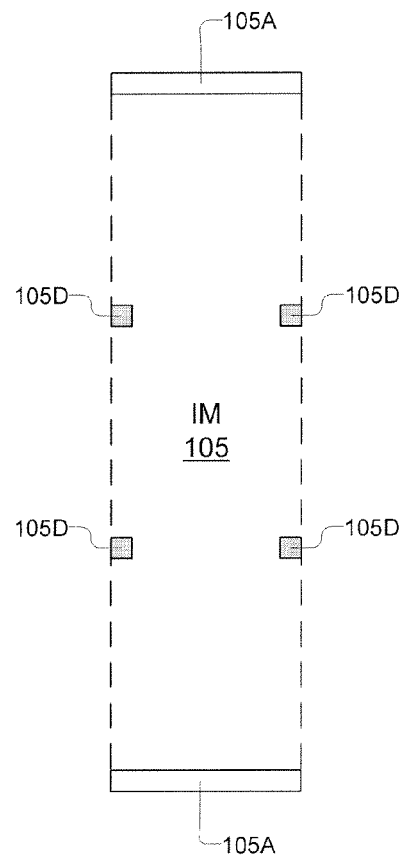
FIGS. 4A and 4B show a structural arrangement of the interior module, in accordance with one embodiment of the present invention.
Figure 4B:
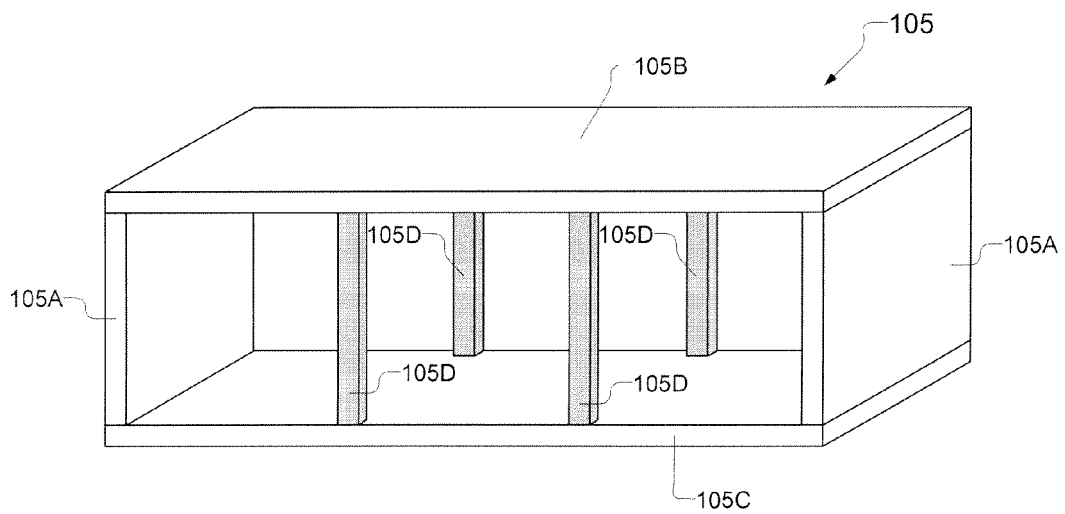

FIGS. 4A and 4B show a structural arrangement of the interior module 105, in accordance with one embodiment of the present invention. The interior module 105 is a partially enclosed structure defined to be secured to either the power-side-end-module 103, the facility-side-end-module 107, another interior module 105, or a combination thereof More specifically, the interior module 105 includes two end walls 105A and a roof 105B. In one embodiment, the interior module 105 includes a floor 105D. In another embodiment, the interior module 105 includes an open floor support frame constructed at the off-site manufacturing facility, and relies upon the foundation at the assembly location to provide the solid flooring surface of the interior module 105. The interior module 105 can also include a number of structural components 105D to support the roof 105B at the open sides. A number of interior modules 105 are connected together in a side-to-side manner so as to extend from the power-side-end-module 103 to the facility-side-end-module 107.

Figure 5:
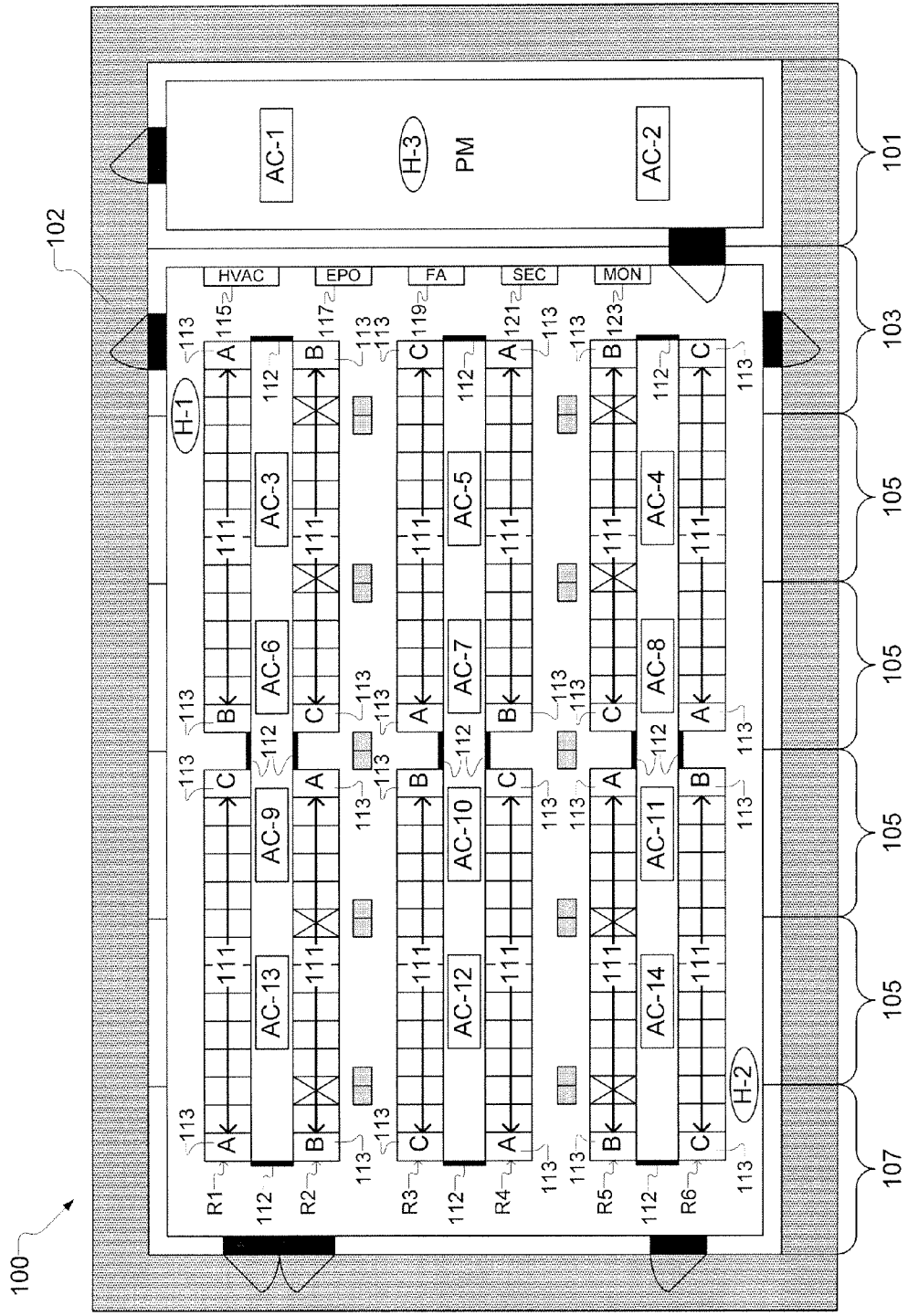
FIG. 5 shows an assembled modular data center equipment layout, in accordance with one embodiment of the present invention.

FIG. 5 shows an assembled modular data center equipment layout, in accordance with one embodiment of the present invention. In this example embodiment, the assembled modular data center 100 includes the power module 101 on one end, followed by the power-side-end-module 103, followed by four interior modules 105, followed by the facility-side-end-module 107. Once the various modules are connected together on the foundation 102, the various modules combine to form a large open space within the assembled modular data center 100, within which data center equipment 111 is to be placed. In this example embodiment, the data center equipment 111 is placed in six equipment rows R1-R6 extending lengthwise within the assembled modular data center 100, from the power-side-end-module 103 toward the facility-side-end-module 107.

In this example embodiment, cold aisles are defined between the first and second rows R1 and R2, between the third and fourth rows R3 and R4, and between the fifth and sixth rows R5 and R6, respectively. Each cold aisle is environmentally isolated at its various access points by flexible sheeting 112, e.g., plastic, vinyl, or rubber curtains. The regions within the data center outside of the cold aisles are referred to as hot aisles/regions. Therefore, hot aisles/regions surround the combination of data equipment rows R1 and R2 and the cold aisle therebetween. Also, hot aisles/regions surround the combination of data equipment rows R3 and R4 and the cold aisle therebetween. And, hot aisles/regions surround the combination of data equipment rows R5 and R6 and the cold aisle therebetween. In this embodiment, the data center equipment 111 within each equipment row R1-R6 is oriented to pull cooling air from the cold aisle and expel the cooling air into its adjacent hot aisle. In one embodiment, power and data distribution trays, i.e., cable trays, are disposed in hot aisles/regions or within structural utility chases to keep cold aisles clear for unimpeded air flow.

Each interior module 105 is equipped with a cooling unit (AC-#, where # is a cooling unit identifier), i.e., air conditioning unit, for each of the cold aisles to be defined within the data center area that will traverse through the interior module 105. In the example embodiment of FIG. 5, each of the three cold aisles traverses through each interior module 105. Therefore, each interior module 105 includes three cooling units for the cold aisles, respectively, such that the assembled modular data center 100 includes twelve cooling units (AC-3 through AC-14) within the data center equipment 111 region.

In one embodiment, the cooling units are installed at the facility location on the roof of the assembled modular data center 100.

Each cooling unit (AC-3 through AC-14) is defined to draw return air directly from its neighboring hot aisles, cool the air, and supply the cooled air directly to the cold aisle over which the cooling unit is disposed. In one embodiment, each cooling unit (AC-3 through AC-14) spans its neighboring data equipment rows, so as to interface with its neighboring hot aisles and the cold aisle over which it extends, thereby avoiding a need for HVAC ducting within the assembled modular data center 100. Also, in one embodiment, the cooling units can be switched to either re-circulate and cool interior air, or to run as a fan drawing in cool outside air and dumping out hot interior air.

The assembled modular data center 100 is further equipped with a number of humidifiers disposed within the open region containing the data center equipment 111. The humidifiers are operated to maintain an acceptable ambient humidity level for the data center equipment 111. In the example embodiment of FIG. 5, the open region containing the data center equipment 111 is equipped with two humidifiers H-1 and H-2. However, it should be understood that in other embodiments the number and placement of humidifiers can be defined as necessary to maintain an acceptable ambient humidity level for whatever data center equipment 111 is present within the assembled modular data center 100.

Additionally, the power module 101 in the example embodiment of FIG. 5 is equipped with two cooling units (AC-1 and AC-2). It should be appreciated that in different embodiments the power module 101 can be equipped with essentially any number of cooling units so long as adequate cooling capacity is provided for the heat dissipating equipment within the power module 101, and so long as sufficient redundancy is provided in the event of loss of one or more cooling units associated with the power module 101. Also, the power module 101 in the example embodiment of FIG. 5 is equipped with a humidifier H-3. It should be appreciated that in different embodiments the power module 101 can be equipped with essentially any number of humidifiers so long as an acceptable ambient humidity level is maintained for whatever equipment is present within the power module 101.

Once the various data center modules are fitted together to Ruin the assembled modular data center 100, a number of data center global systems are installed or interconnected. The data center global systems can include cable trays that run down the hot aisles or structural utility chases to route power cables and data cables through the data center. In one embodiment, modular infrastructure is designed to support and route all necessary cabling so that it is not necessary to route cabling under the foundation, e.g., infrastructure is provided for over foundation cable routing. The data center global systems can also include electrical controls and components distributed throughout the assembled modular data center 100 for global data center systems such as lighting, emergency power off (EPO) 117, HVAC 115, power distribution unit (PDU) monitoring 123, fire alarm/suppression 119, security 121, and electrical grounding. In one embodiment, the data center global system components may be installed at the point of fabrication of individual modules and interconnected during assembly at the modular data center assembly site.

In the example embodiment of FIG. 5, each equipment row R1-R6 includes two sections, with a PDU 113 disposed at each end of each section. Each PDU 113 is electrically connected to supply power to each component of the data center equipment 111 in its equipment row section, such that each component of the data center equipment 111 has a redundant PDU 113 connection. During normal operation, each PDU 113 will distribute power to one-half of the data center equipment 111 components in the equipment row section to which it is connected. However, if one bank (either A, B, or C) of PDUs 113 drops out of service in a given equipment row section, the other PDU 113 in the given equipment row section will take over power distribution to all data center equipment 111 components in the given equipment row section. In this manner, the banks (A, B, C) of PDUs 113 are distributed among the equipment row sections, such that loss of any one bank (either A, B, or C) of PDUs 113 will not interrupt power distribution to the data center equipment 111.

Figure 6:
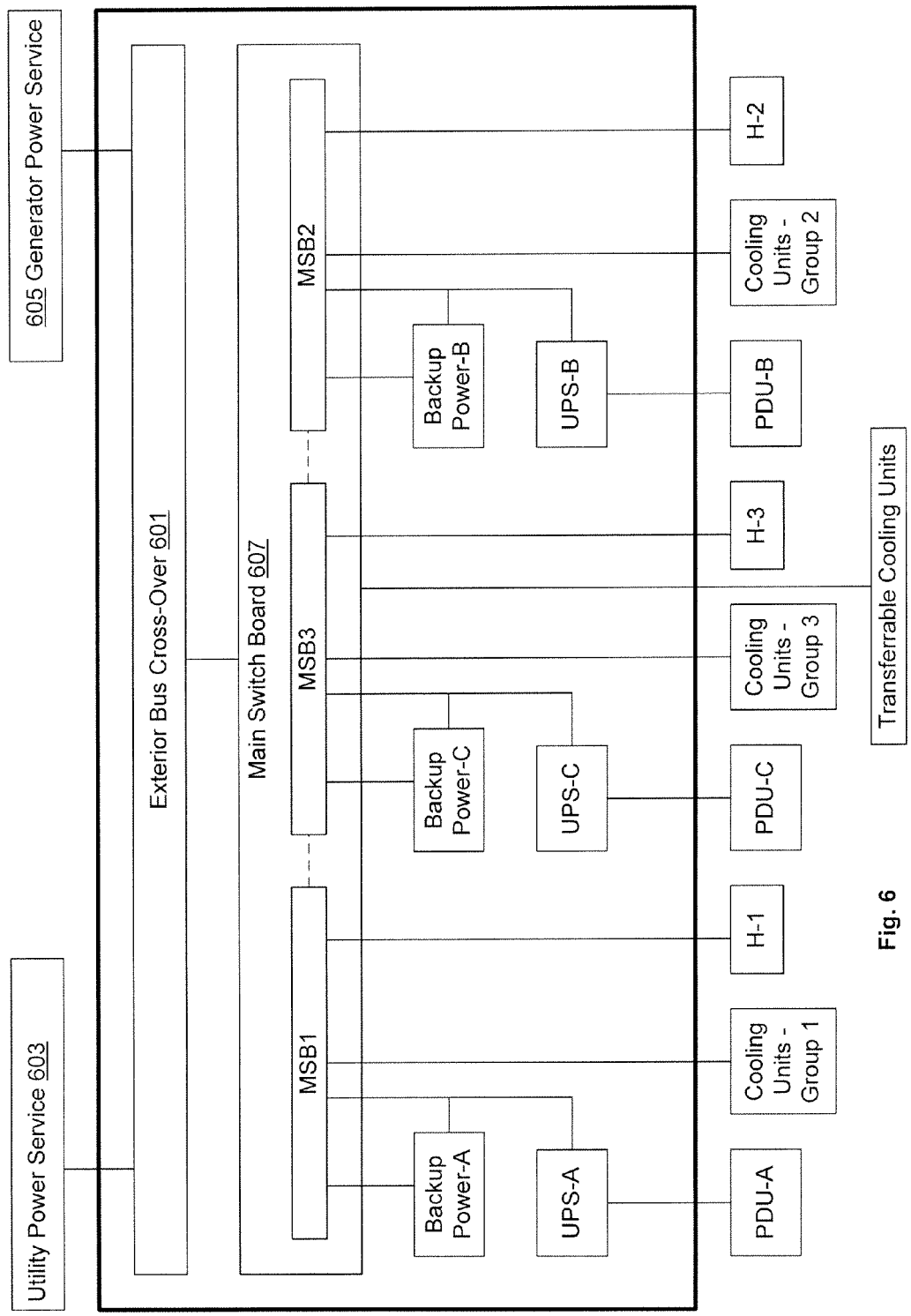
FIG. 6 shows an exemplary architecture of the power module, in accordance with one embodiment of the present invention.

FIG. 6 shows an exemplary architecture of the power module 101, in accordance with one embodiment of the present invention. The power module 101 of FIG. 6 is defined to correspond to the example data center arrangement of FIG. 5. It should be understood that in other embodiments, the power module 101 can be defined to correspond to data center arrangements that are different from that shown in the example of FIG. 5. Thus, the power module 101 is adaptable to suit the assembled modular data center 100 and data center equipment 111 therein.

The power module 101 includes an exterior bus cross-over 601 defined to connect with both a utility power service 603 and a generator power service 605. The utility power service 603 sources power from the utility power grid. More specifically, a utility transformer is acquired for the modular data center assembly site. The modular data center assembly site is laid out so that the utility service, i.e., main service, can be brought in to connect with the power module 101. The utility service, a utility main breaker, and utility metering is disposed outside of power module 101 and feeds into power module 101. It should be understood that the utility service, the utility main breaker, and the utility metering may vary from site-to-site.

The generator power service 605 sources power from onsite power generating equipment, such as a diesel engine connected to an electrical generator. It should be understood that the generator power service 605 can be defined in essentially any manner, so long as the generator power service 605 is capable of sourcing sufficient power for the assembled modular data center 100.

The power module 101 further includes a main switchboard 607 in electrical connection with the exterior bus crossover 601. The main switchboard 607 includes a main bus segment (MSB) for each of a number of uninterruptable power supply (UPS) systems, respectively. In the embodiment of FIG. 6, the main switchboard 607 includes an MSB1 for a UPS-A, an MSB2 for a UPS-C, and an MSB3 for a UPS-B. The main switchboard 607 also includes redundant power transfer systems and an intelligent power transfer system 701. The intelligent power transfer system 701 is designed to ensure that at least two of the three bus main bus segments (MSB1, MSB2, MSB3) have continuous power available based on the availability of either the utility power service 603 or the generator power service 605.

Each UPS system (UPS-A, UPS-B, UPS-C) is connected to a respective backup power source (A, B, C). In various embodiments, the backup power sources (A, B, C) can utilize chemical power storage, e.g., batteries, or mechanical power storage, e.g., fly wheels, or a combination thereof. Each backup power source (A, B, C) is electrically connected to MSB1, MSB2, and MSB3, respectively, so that it can access and store power during normal operation when power is sourced from either the utility power service 603 or the generator power service 605. During normal operation, each UPS system (UPS-A, UPS-B, UPS-C) gets power from its respective MSB (MSB1, MSB2, MSB3). In the event of power loss to the main switchboard 607, each UPS system (UPS-A, UPS-B, UPS-C) gets power from its backup power source (A, B, C). The transition from main switchboard 607 power to the backup power sources (A, B, C) occurs without interruption in power to the UPS systems loads (UPS-A, UPS-B, UPS-C).

The power management and distribution systems within the power module 101 are defined specifically for the data center equipment 111, e.g., computer systems and associated devices, to be disposed with the assembled modular data center 100. Each of UPS systems (UPS-A, UPS-B, and UPS-C) is connected to supply power to a particular set of power distribution units (PDUs) within the assembled modular data center 100. In the example of FIGS. 5 and 6, the UPS systems UPS-A, UPS-B, and UPS-C supply power to the PDU sets PDU-A, PDU-B, and PDU-C, respectively. The power module 101 is defined to provide redundancy and resiliency of power supply to each power distribution unit (PDU) in the assembled modular data center 100. More specifically, the UPS systems (UPS-A, UPS-B, UPS-C) are connected to the main switchboard 607 such that if one UPS fails, its electrical load is split between the remaining UPS systems. For example, if UPS-A goes down, half of its electrical load shifts over to UPS-B and the other half shifts over to UPS-C. This same failover method applies to loss of UPS-B and UPS-C. This failover method is referred to as distributed redundant topology (DRT).

With reference to FIG. 5, because each PDU 113 is capable of supplying the power for the entire data equipment 111 section to which it is connected, when a given set of PDUs 113 goes down, the other sets of PDUs 113 pick up the electrical load for the entire data equipment 111 section. The different sets of PDUs 113, i.e., sets PDU-A, PDU-B, and PDU-C, are distributed among the data equipment 111 sections such that failure of a given UPS system and its corresponding set of PDUs will result in the electrical load of the failed UPS system being split among the remaining UPS systems.

Also, the cooling units (AC-1 through AC-14) are electrically connected to the main bus segments (MSB1, MSB2, MSB3) in a distributed manner, such that loss of a given main bus segment will not compromise cooling in any of the cold aisles within the assembled modular data center 100. In one embodiment, cooling units AC-1, AC-3, AC-8, and AC-14 are collectively designated Cooling Units-Group 1 and are connected to receive power from MSB1. Also in this embodiment, cooling units AC-2, AC-4, AC-9, and AC-13 are collectively designated Cooling Units-Group 2 and are connected to receive power from MSB2. Also in this embodiment, cooling units AC-6, AC-11, and AC-12 are collectively designated Cooling Units-Group 3 and are connected to receive power from MSB3. Also in this embodiment, cooling units AC-5, AC-7, and AC-10 are collectively designated as transferrable cooling units, and are connected to receive power from either MSB1 or MSB2. In this embodiment, cooling units AC-5 and AC-7 are connected to receive power from the same MSB, and cooling unit AC-10 is connected to receive power from the other MSB. For example, if cooling units AC-5 and AC-7 are switched to receive power from MSB1, cooling unit AC-10 is switched to receive power from MSB2. Alternatively, if cooling units AC-5 and AC-7 are switched to receive power from MSB2, cooling unit AC-10 is switched to receive power from MSB1.

Figure 7:
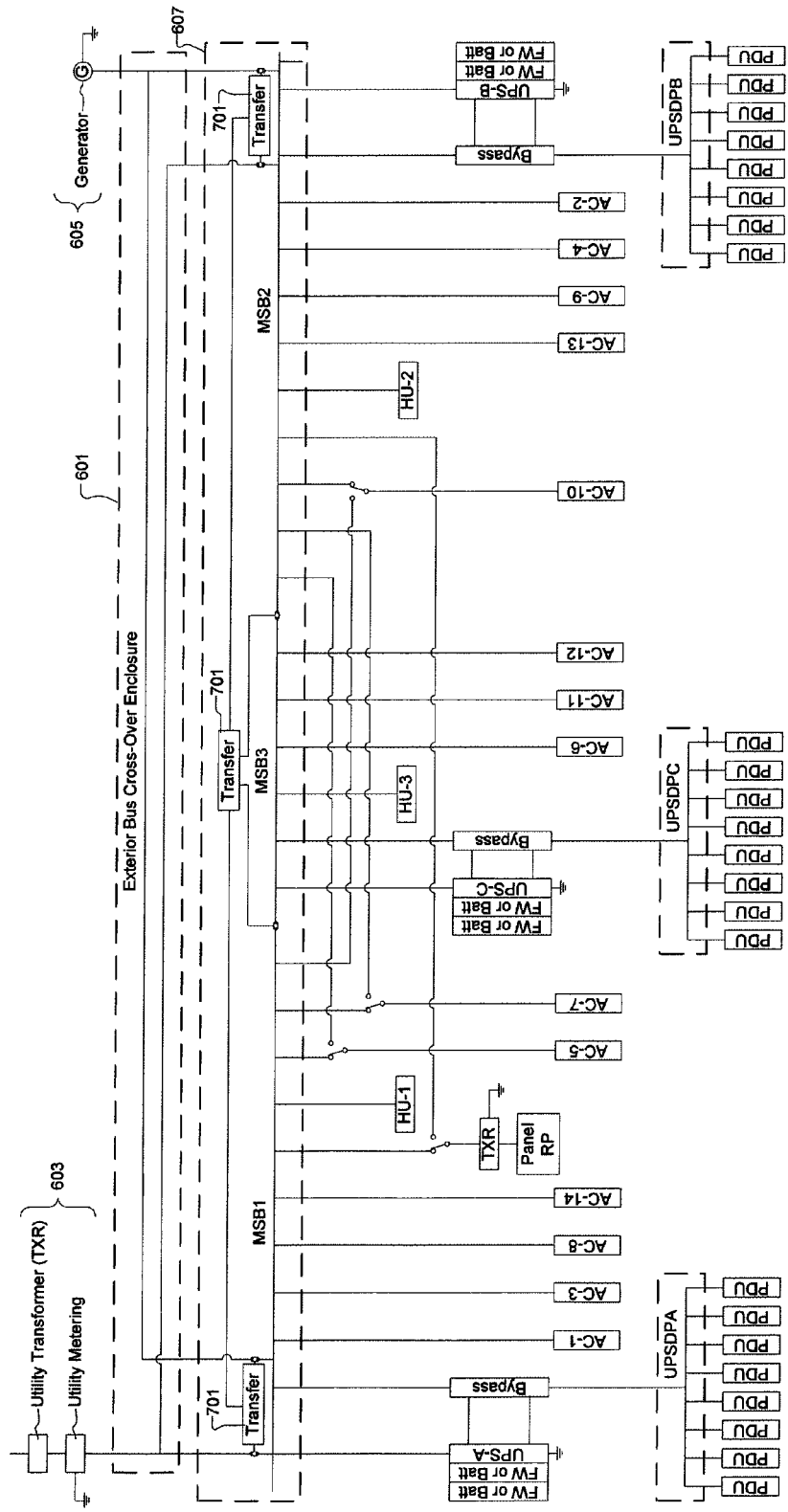
FIG. 7 shows a more detailed schematic of the power module architecture of FIG. 6, in accordance with one embodiment of the present invention.

The power module 101 is further defined to supply power to the humidifiers H-1, H-2, and H-3 within the assembled modular data center 100. Specifically, humidifier H-1 is connected to receive power from MSBI. Humidifier H-2 is connected to receive power from MSB2. Humidifier H-3 is connected to receive power from MSB3. FIG. 7 shows a more detailed schematic of the power module 101 architecture of FIG. 6, in accordance with one embodiment of the present invention. It should be understood that the power module 101 shown in FIGS. 6 and 7 is defined based on the particular assembled modular data center 100 arrangement shown in FIG. 5, including the specific layout of data equipment 111.

It should be understood that the modular data center 100 arrangement and corresponding power management system, i.e., power module 101, is pre-designed so that the power is orchestrated specifically for the assembled modular data center 100 arrangement. It should be appreciated that the power module 101 provides a concurrently maintainable electrical system for the assembled modular data center 100. In one embodiment, the power module 101 is designed to provide 600 kW to the assembled modular data center 100. Multiple power modules 101 can be utilized to provide increased power capacity. For example, two 600 kW power modules 101 can be utilized to provide 1200 kW, four 600 kW power modules 101 can be utilized to provide 2400 kW, etc. Also, in other embodiments, the power capacity of the power module 101 can vary from 600 kW to whatever power capacity is necessary for the assembled modular data center 100. Thus, it should be understood that the power module 101 is scalable in power capacity.

In accordance with the foregoing, a modular data center (100) is disclosed. The modular data center (100) includes a foundation (102). A number of structural modules (103, 105, 107) are configured to be secured together and to be secured to the foundation. Each of the number of structural modules is without one or more sidewalls, such that when the number of structural modules are secured together they form a building structure that encloses an open region. The open region continuously extends through interiors of the number of structural modules. Also, each of the number of structural modules is structurally formed to be independently transported.

In one embodiment, each of the number of structural modules (103, 105, 107) is defined to include a roof and at least two opposing sidewalls. In a particular embodiment, the number of structural modules includes one or more interior modules (105) each defined to include a roof and two opposing sidewalls. Also, in this particular embodiment, the number of structural modules includes two end modules (103, 107) each defined to include a roof, two opposing sidewalls, and a third sidewall extending between the two opposing sidewalls. And, in this particular embodiment, the one or more interior modules (105) are disposed in a side-to-side manner between the two end modules (103, 107), such that the two opposing sidewalls of each of the number of structural modules are aligned on respective sides of the building structure formed by the number of structural modules. It should be understood that an open side region of each of the number of structural modules (103, 105, 107) that is without a corresponding sidewall includes one or more structural members (103E, 107E, 105D) to support the roof (103C, 107C, 105B) of the structural module at the open side region.

The modular data center (100) also includes data equipment (111) deployed within the open region of the building structure formed by the number of structural modules (103, 105, 107). In one embodiment, the data equipment (111) is deployed within an even number of parallel data equipment rows (R1, R2, R3, R4, R5, R6), wherein a respective region between each successive pair of data equipment rows (R1/R2, R3/R4, R5/R6) defines a respective cold aisle into which cooling air is to be supplied. The data equipment (111) is oriented to draw cooling air in from an adjacent cold aisle and exhaust cooling air to a return air region outside of the cold aisles. Each cold aisle is environmentally isolated from the return air region by a combination of data equipment (111) and insulating curtains (112) extending between data equipment (111). Additionally, a number of cooling units (AC-3 through AC-14) are disposed on a roof of the building structure formed by the number of structural modules (103, 105, 107) so as to expel cooling air directly into a given cold aisle. Each of the number of cooling units (AC-3 through AC-14) is defined to directly draw return air from the return air region outside of the cold aisles. Therefore, the assembled modular data center (100) does not require ducting for air flow management.

In one embodiment, each data equipment row (R1, R2, R3, R4, R5, R6) is partitioned into a number of data equipment row sections. Each data equipment row section is electrically connected to receive electrical power from an associated pair of complementary power distribution units (113). During normal operation, each of the pair of complementary power distribution units (113) is defined to supply electrical power to about one-half of the data equipment (111) within the associated data equipment row section. During loss of either of the pair of complementary power distribution units (113), the other of the pair of complementary power distribution units (113) is defined to supply electrical power to all data equipment (111) within the associated data equipment row section.

The modular data center (100) further includes a power module (101) configured to be secured to one of the number of structural modules (e.g., 103) and to be secured to the foundation (102). The power module (101) is defined as an enclosed structure and is structurally formed to be independently transported. The power module (101) is equipped with electrical components for supplying and distributing electrical power to the data equipment (111) deployed within the open region of the building structure formed by the number of structural modules (103, 105, 107).

The power module (101) is configured to receive electrical power from an outside electrical power source (603, 605). In one embodiment, the outside electrical power source is either a utility electrical power service (603) or a generator electrical power service (605). The power module (101) includes a main switchboard (607) having a number of separate and independently controllable main bus segments (MSB1, MSB2, MSB3) electrically connected in a respective manner to each of a number of uninterruptable power supply systems (UPS-A, UPS-B, UPS-C). Each of the number of uninterruptable power supply systems (UPS-A, UPS-B, UPS-C) is electrically connected to supply electrical power to a respective set of power distribution units (113: PDU-A, PDU-B, PDU-C), which are in turn electrically connected to supply electrical power to a portion of the data equipment (111) deployed within the open region of the building structure formed by the number of structural modules (103, 105, 107).

In one embodiment, the power module (101) includes an intelligent power transfer system 701 configured to ensure that an electrical load associated with a given main bus segment (MSB1, MSB2, MSB3) is transferred to other main bus segments when the given main bus segment is inoperable. Also, each of the main bus segments (MSB1, MSB2, MSB3) is electrically connected to supply electrical power to a number of cooling units (AC-1 through AC-14) of the modular data center (100) in a distributed manner, such that loss of a given main bus segment does not unacceptably compromise cooling in any region of the modular data center.

Each of the number of uninterruptable power supply systems (UPS-A, UPS-B, UPS-C) is electrically connected to receive electrical power from a respective backup power source (Backup Power-A, B, C) when electrical power is not available from the main bus segment to which the uninterruptable power supply system is electrically connected. Each backup power source (Backup Power-A, B, C) is electrically connected to the main bus segment (MSB1, MSB2, MSB3) to which its corresponding uninterruptable power supply system (UPS-A, UPS-B, UPS-C) is electrically connected, such that during normal operation each backup power source receives electrical power from the main bus segment to which it is electrically connected. Each backup power source (Backup Power-A, B, C) is configured to utilize chemical power storage, mechanical power storage, or a combination thereof.

In another embodiment, a method is disclosed for making a modular data center (100). The method includes fabricating a foundation (102) at an assembly location of the modular data center. The method also includes fabricating a number of structural modules (103, 105, 107) at a first remote location away from the assembly location of the modular data center. Each structural module (103, 105, 107) is fabricated to be secured together and to be secured to the foundation (102) at the assembly location of the modular data center (100). Each of the number of structural modules (103, 105, 107) is fabricated without one or more sidewalls, such that when the number of structural modules are secured together at the assembly location of the modular data center they form a building structure that encloses an open region. Each of the number of structural modules (103, 105, 107) is structurally formed to be independently transported.

In one embodiment, the number of structural modules (103, 105, 107) includes one or more interior modules (105), each fabricated to include a roof and two opposing sidewalls. Also, in this embodiment, the number of structural modules (103, 105, 107) includes two end modules (103, 107) each fabricated to include a roof, two opposing sidewalls, and a third sidewall extending between the two opposing sidewalls. In this embodiment, the one or more interior modules (105) are secured together in a side-to-side manner between the two end modules (103, 107), such that the two opposing sidewalls of each of the number of structural modules are aligned on respective sides of the building structure formed by securing the number of structural modules (103, 105, 107) together.

The method also includes fabricating a power module (101) at a second remote location away from the assembly location of the modular data center (100). The power module (101) is fabricated as an enclosed structure and is structurally formed to be independently transported. The power module (101) is equipped at the remote location with electrical components for supplying and distributing electrical power to data equipment (111) to be deployed within the open region of the building structure formed by the number of structural modules (103, 105, 107).

The method also includes transporting the number of structural modules (103, 105, 107) from the first remote location to the assembly location of the modular data center (100), and transporting the power module (101) from the second remote location to the assembly location of the modular data center (100). The method also includes securing the number of structural modules (103, 105, 107) together at the assembly location of the modular data center (100) and to the foundation (102) to form the building structure that encloses the open region, such that the open region continuously extends through interiors of the number of structural modules (103, 105, 107). The method also includes securing the power module (101) to one of the number of structural modules (e.g., 103) and to the foundation (102) at the assembly location of the modular data center (100).

The method further includes deploying data equipment (111) within the open region of the building structure formed by the number of structural modules (103, 105, 107) at the assembly location of the modular data center (100). In one embodiment, portions of the data equipment (111) may be deployed in various structural modules (103, 105, 107) during their off-site fabrication. In one embodiment, the data equipment (111) is deployed within an even number of parallel data equipment rows (R1, R2, R3, R4, R5, R6). A respective region between each successive pair of data equipment rows (R1/R2, R3/R4, R5/R6) defines a respective cold aisle into which cooling air is to be supplied. The data equipment (111) is oriented to draw cooling air in from an adjacent cold aisle and exhaust cooling air to a return air region outside of the cold aisles. In one embodiment, insulating curtains (112) are disposed to extend between data equipment rows (R1, R2, R3, R4, R5, R6) such that each cold aisle is environmentally isolated from the return air region by a combination of data equipment (111) and insulating curtains (112). The method also includes installing a number of cooling units (AC-3 through AC-14) on a roof of the building structure formed by the number of structural modules (103, 105, 107) so as to expel cooling air directly into a given cold aisle. Each of the number of cooling units (AC-3 through AC-14) is defined to directly draw return air from the return air region outside of the cold aisles.

In one embodiment, the data equipment (111) is deployed such that each data equipment row (R1, R2, R3, R4, R5, R6) is partitioned into a number of data equipment row sections. In this embodiment, the method includes electrically connecting a pair of complementary power distribution units (113) to supply electrical power to a given data equipment row section. During normal operation, each of the pair of complementary power distribution units (113) is defined to supply electrical power to about one-half of the data equipment (111) within the given data equipment row section. During failure of either of the pair of complementary power distribution units (113), the other of the pair of complementary power distribution units (113) is defined to supply electrical power to all data equipment (111) within the given data equipment row section.

In another embodiment, a power module (101) for a modular data center (100) is disclosed. The power module (101) includes a main switchboard (607) configured to receive electrical power from an outside electrical power source (603, 605). The main switchboard (607) includes a number of separate and independently controllable main bus segments (MSB1, MSB2, MSB3). Each of the main bus segments (MSB1, MSB2, MSB3) is electrically connected to supply electrical power to a number of cooling units (AC-1 through AC-14) of the modular data center (100) in a distributed manner, such that failure of a given main bus segment does not unacceptably compromise cooling in any region of the modular data center.

The power module (101) also includes a number of uninterruptable power supply systems (UPS-A, UPS-B, UPS-C) electrically connected in a respective manner to the main bus segments (MSB1, MSB2, MSB3). Each of the number of uninterruptable power supply systems (UPS-A, UPS-B, UPS-C) is defined to supply electrical power to a respective set of power distribution units (113: PDU-A, PDU-B, PDU-C) within the modular data center (100). Each set of power distribution units (113) supplies electrical power to a respective portion of data equipment (111) within the modular data center (100). The power module (101) further includes an intelligent power transfer system 701 configured to ensure that an electrical load associated with a given main bus segment is transferred to other main bus segments when the given main bus segment is inoperable.

The power module (101) also includes a number of backup power sources (Backup Power-A, B, C) electrically connected to supply electrical power to a respective one of the number of uninterruptable power supply systems (UPS-A, UPS-B, UPS-C) when electrical power is not available from the main bus segment (MSB1, MSB2, MSB3) to which the respective one of the uninterruptable power supply systems (UPS-A, UPS-B, UPS-C) is electrically connected. Each backup power source (Backup Power-A, B, C) is electrically connected to the main bus segment (MSB1, MSB2, MSB3) to which the respective one of the uninterruptable power supply systems (UPS-A, UPS-B, UPS-C) is electrically connected. During normal operation, each backup power source (Backup Power-A, B, C) receives electrical power from the main bus segment (MSB1, MSB2, MSB3) to which it is electrically connected. In various embodiments, each backup power source (Backup Power A, B, C) is configured to utilize chemical power storage, mechanical power storage, or a combination thereof.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A power module, comprising:
an enclosed structure configured to be secured to a structural module of a modular data center, the enclosed structure formed to be transportable; and
electrical equipment disposed within the enclosed structure and defined to provide a concurrently maintainable electrical system for the modular data center to which the enclosed structure is to be secured,
the electrical equipment including a main switchboard that includes a plurality of main bus segments,
the electrical equipment including a plurality of uninterruptable power supply systems,
each of the plurality of main bus segments defined to supply power to a corresponding one of the plurality of uninterruptable power supply systems,
the plurality of main bus segments collectively defined such that in response to failure of a given one of the plurality of uninterruptable power supply systems an electrical load of the given one of the plurality of uninterruptable power supply systems is split in a substantially equal manner among an operational remainder of the plurality of uninterruptable power supply systems,
the electrical equipment including a plurality of backup power sources separate from the plurality of uninterruptable power supply systems, each of the plurality of backup power sources electrically connected to supply backup power to a corresponding one of the plurality of uninterruptable power supply systems,
wherein the power module is scalable in power supply capacity.

2. The power module as recited in claim 1, wherein the electrical equipment is defined to provide redundancy of power supply to each of a number of power distribution units in the modular data center.

3. The power module as recited in claim 1, wherein the electrical equipment includes an exterior bus cross-over defined to connect with both a utility power service and a generator power service.

4. The power module as recited in claim 3, wherein the main switchboard is electrically connected to the exterior bus cross-over.

5. The power module as recited in claim 1, wherein each of the plurality of backup power sources is defined to utilize either chemical power storage, or mechanical power storage, or a combination of chemical power storage and mechanical power storage.

6. The power module as recited in claim 1, wherein each of the plurality of backup power sources is electrically connected to a respective one of the plurality of main bus segments to enable the backup power source to access and store power when power is sourced from either the utility power service or the generator power service.

7. The power module as recited in claim 1, wherein each of the plurality of uninterruptable power supply systems is connected to supply power to a particular set of power distribution units within the modular data center to which the enclosed structure is to be secured.

8. The power module as recited in claim 7, wherein each power distribution unit is defined to supply power to an entire data equipment section within the modular data center to which the enclosed structure is to be secured.

9. The power module as recited in claim 1, wherein the main switchboard includes a redundant power transfer system.

10. The power module as recited in claim 1, wherein the main switchboard includes an intelligent power transfer system defined to ensure that the plurality of main bus segments have continuous power available based on availability of either the utility power service or the generator power service.

11. The power module as recited in claim 1, wherein the plurality of main bus segments are connected to provide power to a plurality of cooling units within the modular data center to which the enclosed structure is to be secured, the plurality of main bus segments defined such that failure of a given one of the plurality of main bus segments will not compromise a supply of power to the plurality of cooling units necessary to maintain sufficient cooling in the modular data center.

12. A modular data center, comprising:
a foundation;
a number of structural modules secured to the foundation, each of the number of structural modules without one or more sidewalls such that an assembly of the number of structural modules encloses an open region; and
a power module secured to the foundation and secured to one of the number of structural modules, the power module defined as an enclosed structure, the power module equipped with electrical components for supplying and distributing electrical power to data equipment to be deployed within the open region,
wherein each of the number of structural modules and the power module is independently transportable.

13. The modular data center as recited in claim 12, wherein the power module is configured to receive electrical power from an outside electrical power source, the power module including a main switchboard having a number of separate and independently controllable main bus segments electrically connected in a respective manner to each of a number of uninterruptable power supply systems, wherein each of the number of uninterruptable power supply systems is electrically connected to supply electrical power to a respective set of power distribution units which are electrically connected to supply electrical power to a portion of the data equipment to be deployed within the open region.

14. The modular data center as recited in claim 13, wherein the power module includes an intelligent power transfer system configured to ensure that an electrical load associated with a given main bus segment is transferred to other main bus segments when the given main bus segment is inoperable.

15. The modular data center as recited in claim 13, wherein each of the number of uninterruptable power supply systems is electrically connected to receive electrical power from a respective backup power source when electrical power is not available from the main bus segment to which the uninterruptable power supply system is electrically connected, wherein each backup power source is electrically connected to the main bus segment to which its corresponding uninterruptable power supply system is electrically connected, such that during normal operation each backup power source receives electrical power from the main bus segment to which it is electrically connected.

16. The modular data center as recited in claim 12, wherein each of the number of structural modules is defined to include a roof and at least two opposing sidewalls.

17. The modular data center as recited in claim 16, wherein the number of structural modules includes two end modules each defined to include a roof, two opposing sidewalls, and a third sidewall extending between the two opposing sidewalls.

18. The modular data center as recited in claim 17, wherein the number of structural modules includes one or more interior modules each defined to include a roof and two opposing sidewalls, the one or more interior modules disposed between the two end modules.

19. The modular data center as recited in claim 12, further comprising:
- data equipment deployed within an even number of parallel data equipment rows within the open region, each data equipment row partitioned into a number of data equipment row sections; and
- a pair of complementary power distribution units electrically connected to supply electrical power to a given data equipment row section, each of the pair of complementary power distribution units defined to supply electrical power to all of the data equipment within the given data equipment row section.

* * * * *